(12) United States Patent
Seibert et al.

(10) Patent No.: US 8,922,993 B2
(45) Date of Patent: Dec. 30, 2014

(54) POWER ADAPTER SECURITY SYSTEM

(75) Inventors: Philip Seibert, Round Rock, TX (US); Charles Robison, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 929 days.

(21) Appl. No.: 13/087,812

(22) Filed: Apr. 15, 2011

(65) Prior Publication Data

US 2012/0262860 A1   Oct. 18, 2012

(51) Int. Cl.
*H05K 5/00* (2006.01)
*H05K 5/02* (2006.01)
*E05B 73/00* (2006.01)

(52) U.S. Cl.
CPC ........... *H05K 5/0217* (2013.01); *E05B 73/0082* (2013.01); *E05B 73/0005* (2013.01)
USPC .................................................. 361/679.57

(58) Field of Classification Search
USPC .................................................. 361/679.57
See application file for complete search history.

(56) References Cited

U.S. PATENT DOCUMENTS

| | | | |
|---|---|---|---|
| 6,763,688 B1 | 7/2004 | Syu | |
| 8,282,687 B2 * | 10/2012 | Upton | ............................ 726/35 |
| 2011/0277308 A1 * | 11/2011 | Gilbert | ....................... 29/525.01 |

* cited by examiner

*Primary Examiner* — Ramon Barrera
(74) *Attorney, Agent, or Firm* — Haynes and Boone, LLP

(57) ABSTRACT

A power adapter security system includes a power adapter base. An object securing element is located on the power adapter base. The object securing element is operable to secure the power adapter base to an object. A power cable extends from the power adapter base. A power connector is located on the power cable and operable to transmit power from the power adapter base. A security connector is located on the power cable and is operable to lock the power cable to an IHS chassis. The object securing element may be used to secure the power adapter to an object and each of the power connector and security connector may be coupled to an IHS chassis to provide power to the IHS chassis and secure the IHS chassis to the object.

18 Claims, 19 Drawing Sheets

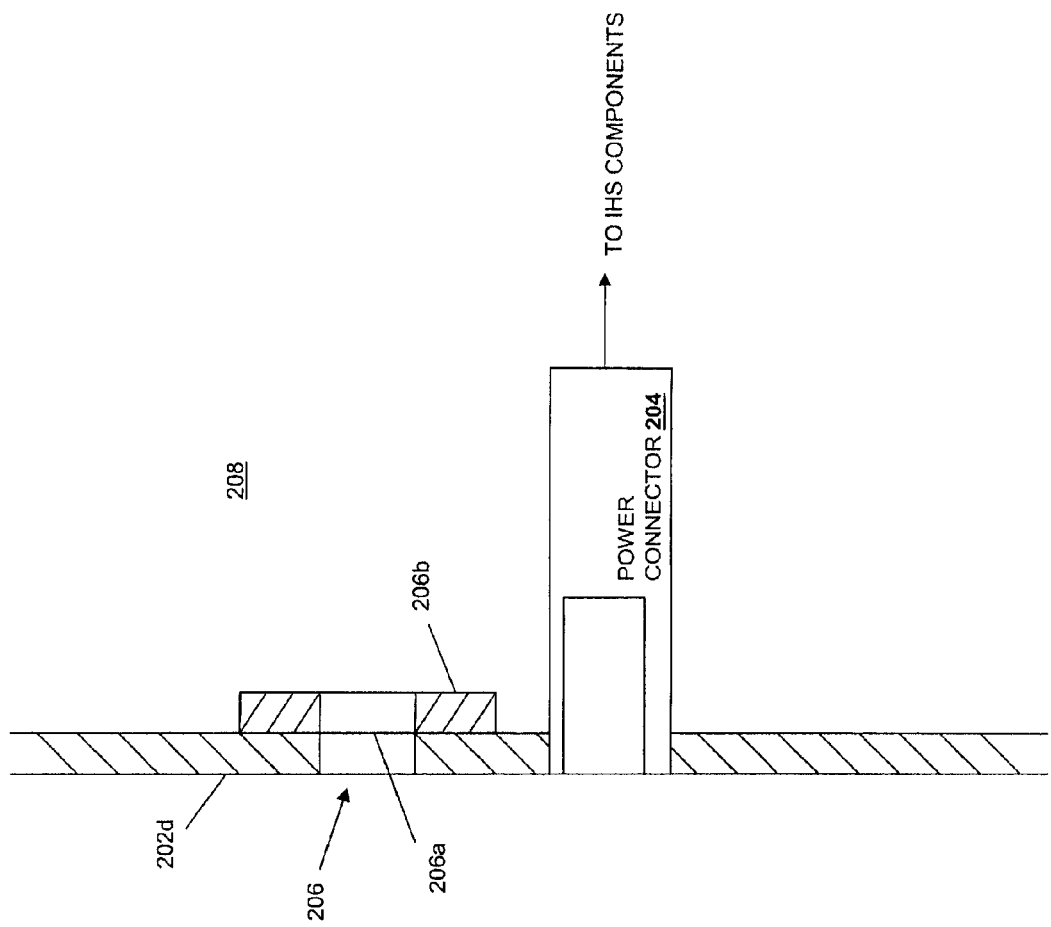

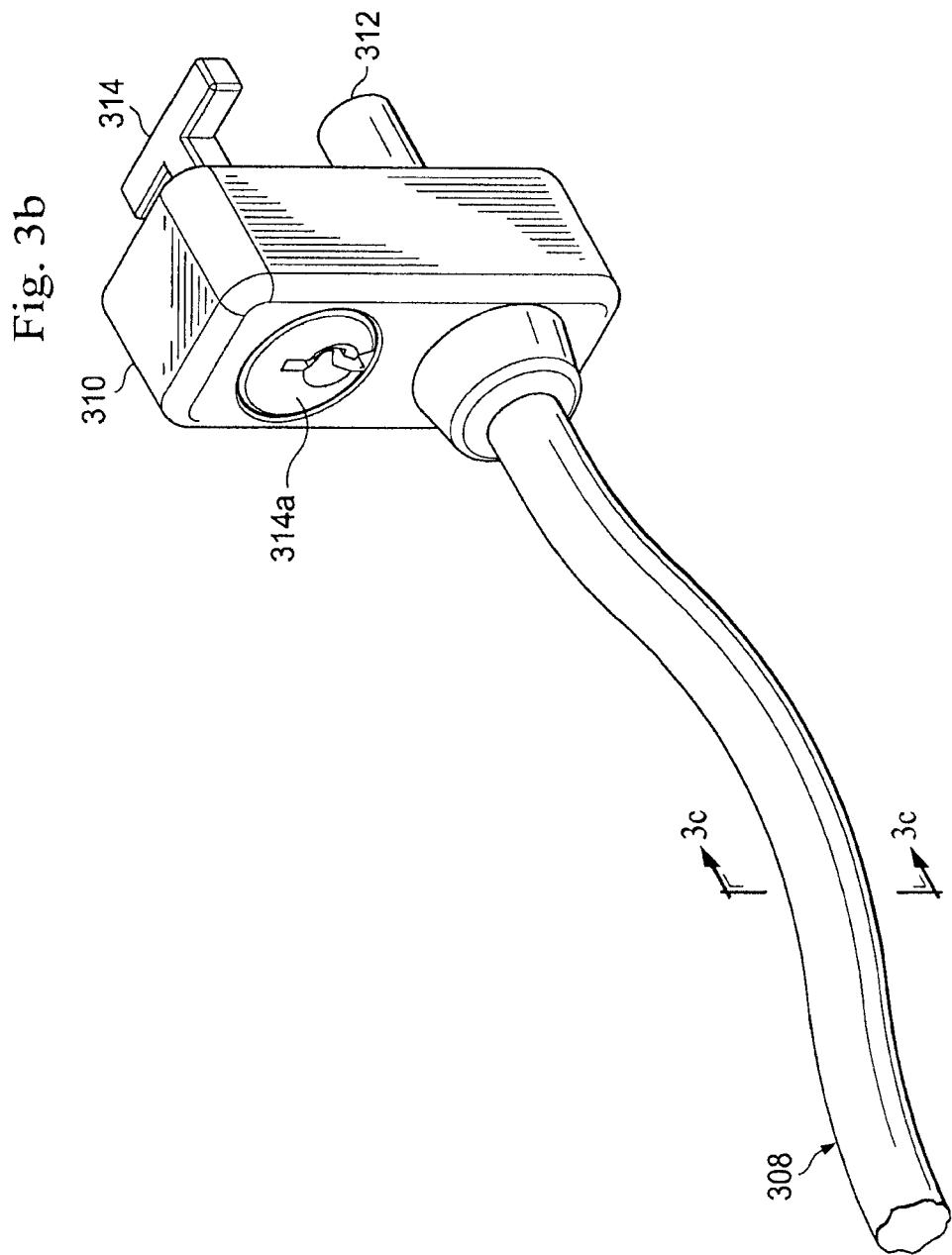

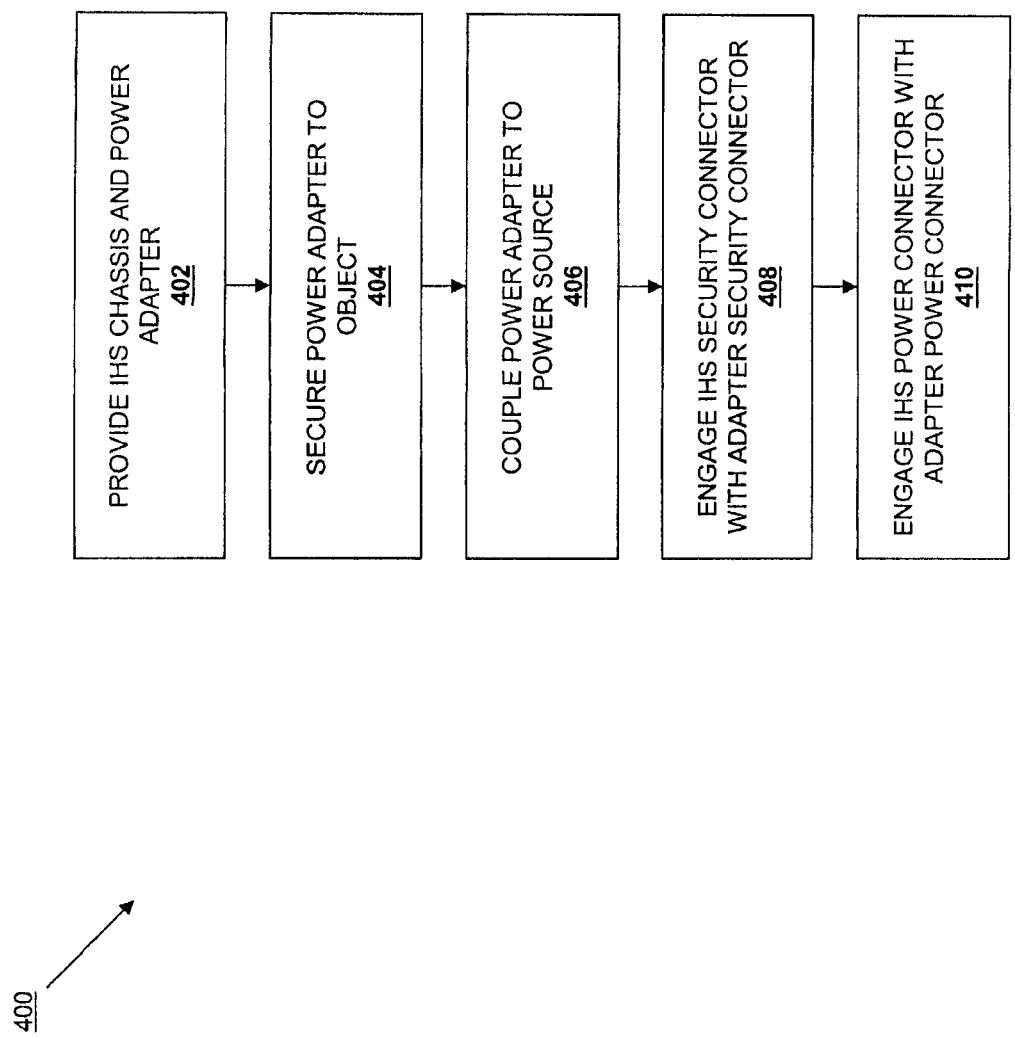

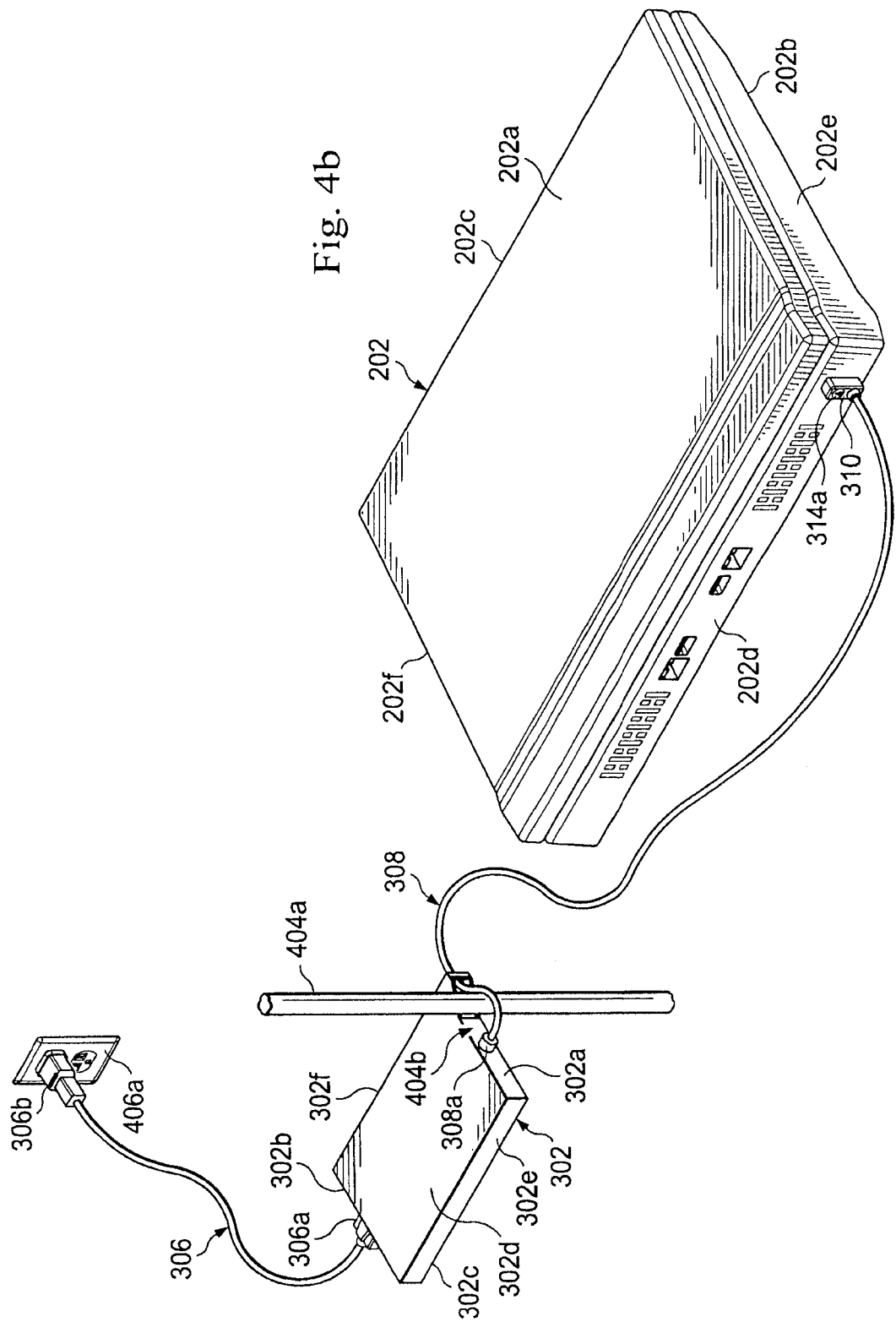

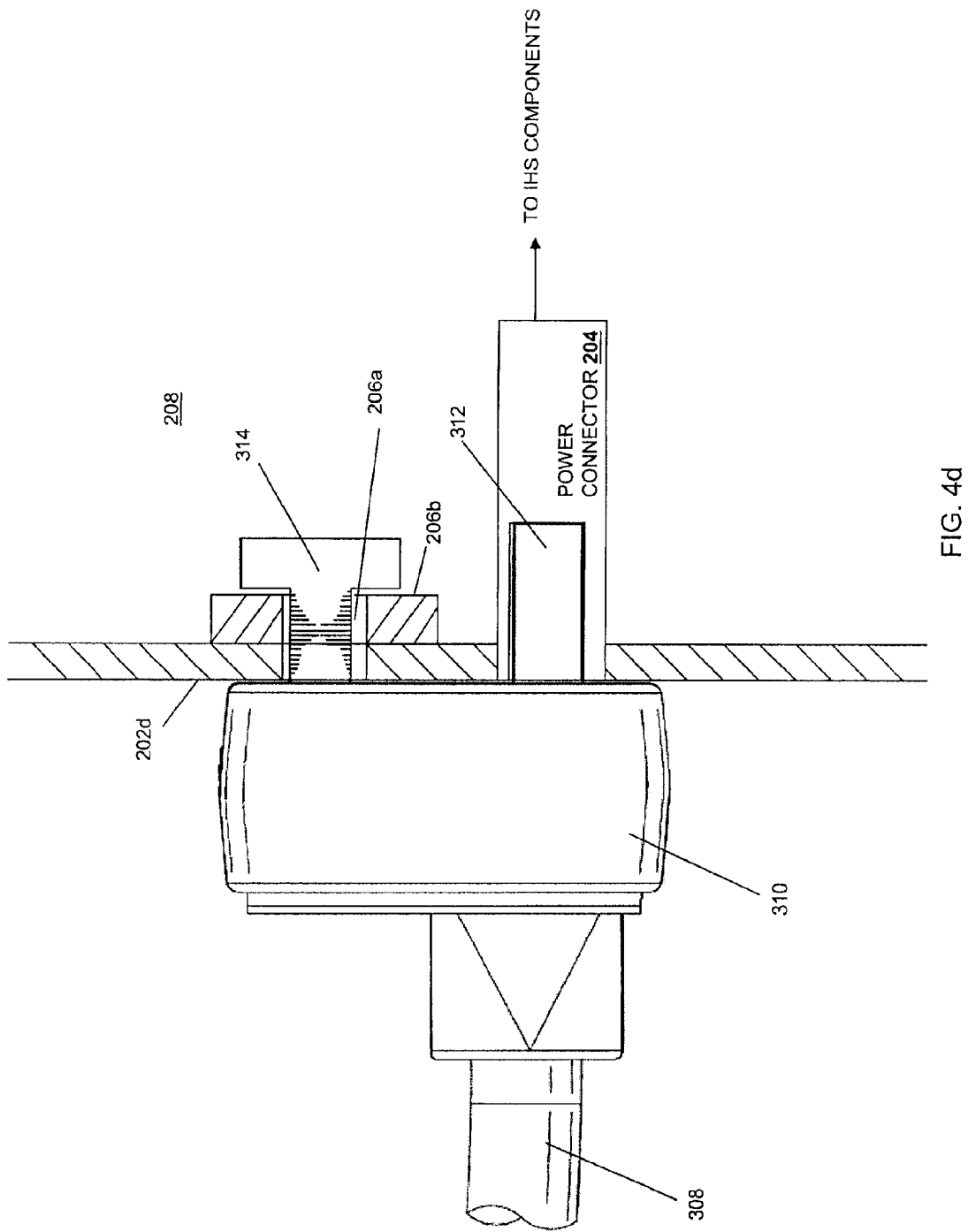

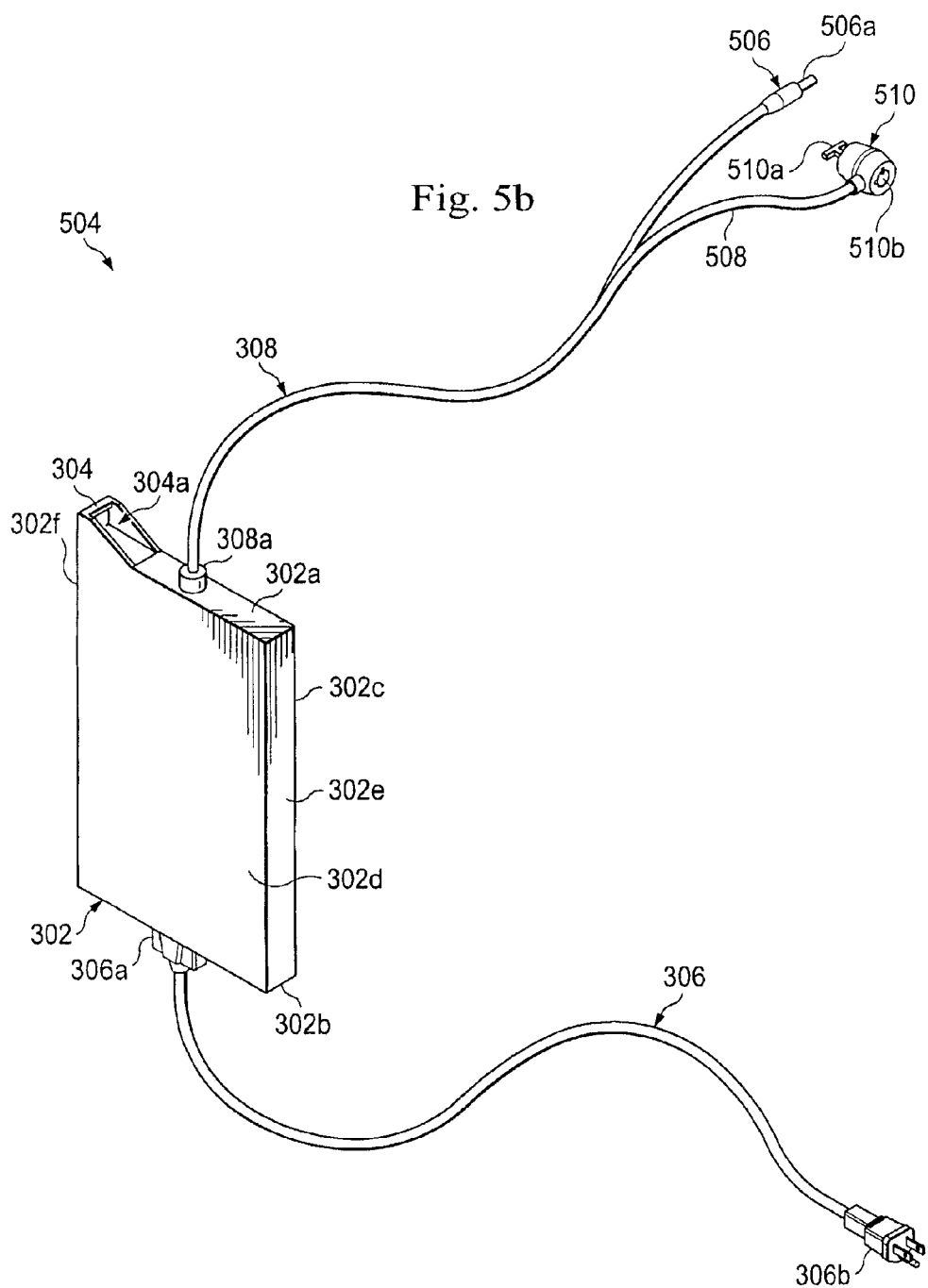

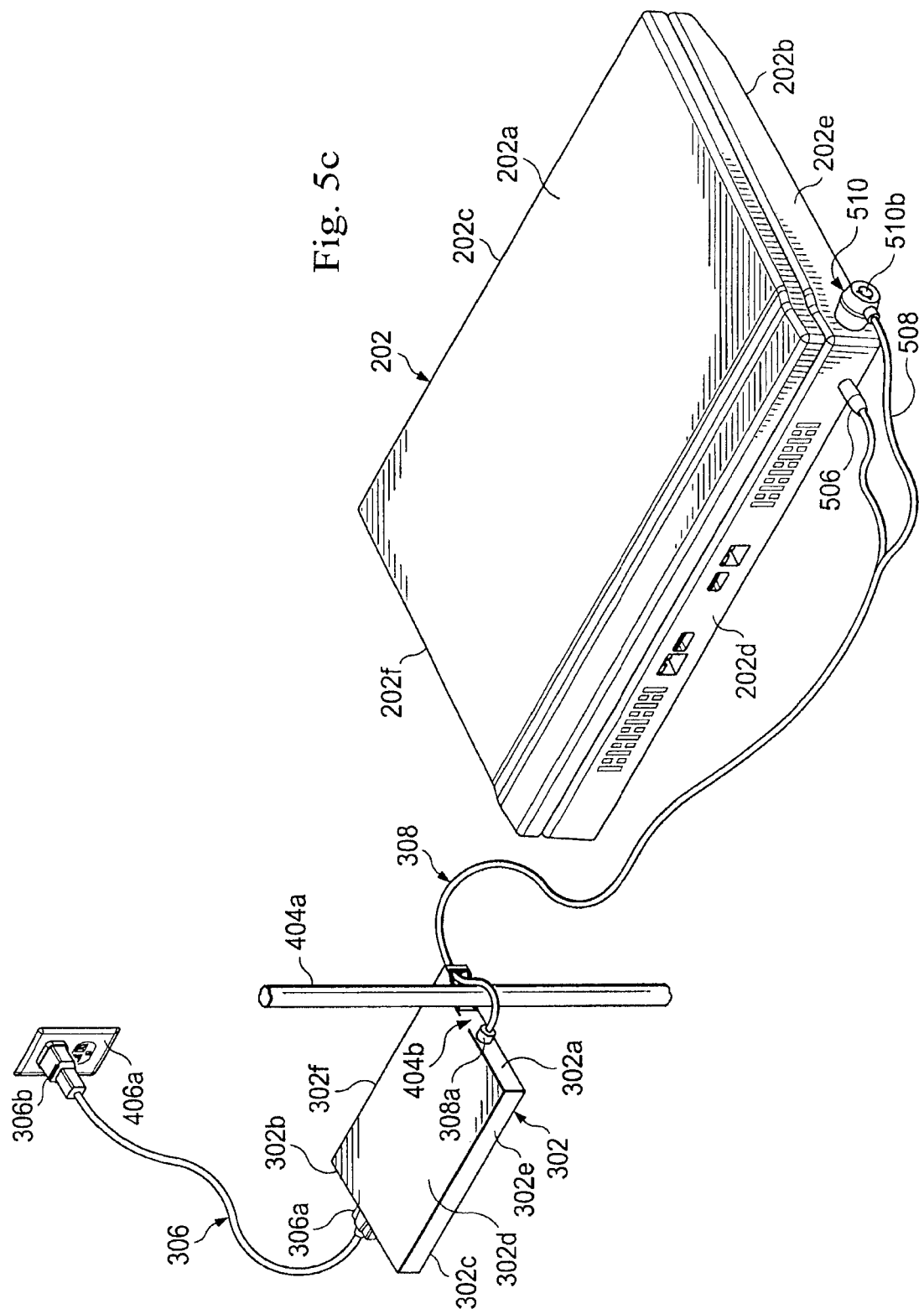

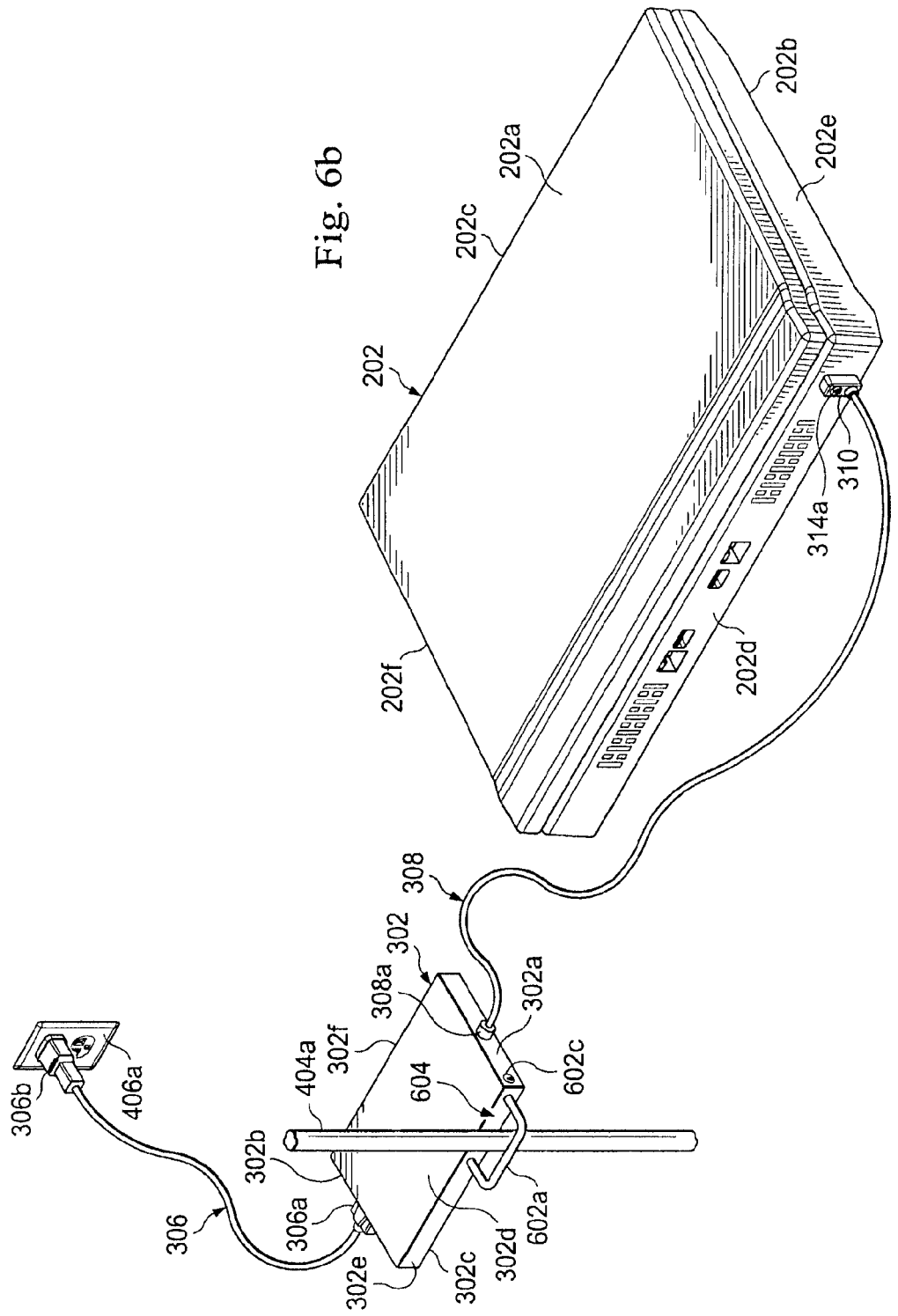

POWER ADAPTER SECURITY SYSTEM

BACKGROUND

The present disclosure relates generally to information handling systems, and more particularly to power adapter security system for an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Portable IHSs such as, for example, notebook computers, netbook computers, laptop computers, tablet computers, and/or a variety of other portable IHSs known in the art, are desirable for many users due to their mobility. However, the mobility of portable IHSs raises a number of issues. For example, portable IHS mobility requires that the portable IHS run on power from a battery that must be periodically recharged. In order to ensure that the battery may be recharged when needed, the user of the portable IHS must carry around a powering device that includes a power adapter with cables that connect to the portable IHS and a power source (e.g., an AC outlet). Furthermore, portable IHSs may be easily stolen due to their relatively small size. Users may prevent their portable IHSs from being stolen by securing the IHS using a security device, but such security devices typically require that the user carry around a lock and security cable that connect to the portable IHS and an relatively immobile object. Thus, in order to enable mobility and security for a portable IHS, users must carry around multiple devices with associating cabling, thereby reducing the mobility of the portable IHS.

Accordingly, it would be desirable to provide an improved system for powering and securing an IHS.

SUMMARY

According to one embodiment, a power adapter security system includes a power adapter base, an object securing element located on the power adapter base and operable to secure the power adapter base to an object, a power cable extending from the power adapter base, a power connector that is located on the power cable and that is operable to transmit power from the power adapter base, and a security connector that is located on the power cable and that is operable to lock the power cable to a device.

BRIEF DESCRIPTION OF THE DRAWINGS

FIG. 2b is a cross-sectional view illustrating an embodiment of the IHS of FIG. 2a.

FIG. 3b is a perspective view illustrating an embodiment of a connector base that is located on the power adapter of FIG. 3a and that includes an adapter power connector and an adapter security connector.

FIG. 3c is a cross-sectional view illustrating an embodiment of a power cable that is located on the power adapter of FIG. 3a.

FIG. 4a is a flow chart illustrating an embodiment of a method for powering and securing an IHS.

FIG. 4b is a perspective view illustrating an embodiment of the power adapter of FIGS. 3a, 3b, and 3c secured to an object and the IHS of FIGS. 2a and 2b, and providing power to the IHS.

FIG. 4d is a cross-section view illustrating an embodiment of the adapter power connector and adapter security connector of FIG. 3b engaging to the IHS of FIGS. 2a and 2b.

FIG. 5b is a perspective view illustrating an embodiment of a power adapter used with the IHS of FIG. 5a.

FIG. 5c is a perspective view illustrating an embodiment of the power adapter of FIG. 5b secured to an object and the IHS of FIG. 5a, and providing power to the IHS.

FIG. 6b is a perspective view illustrating an embodiment of the power adapter of FIG. 6a secured to an object and the IHS of FIGS. 2a and 2b, and providing power to the IHS.

FIG. 8 is a cross sectional view illustrating an embodiment of the IHS of FIG. 2a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
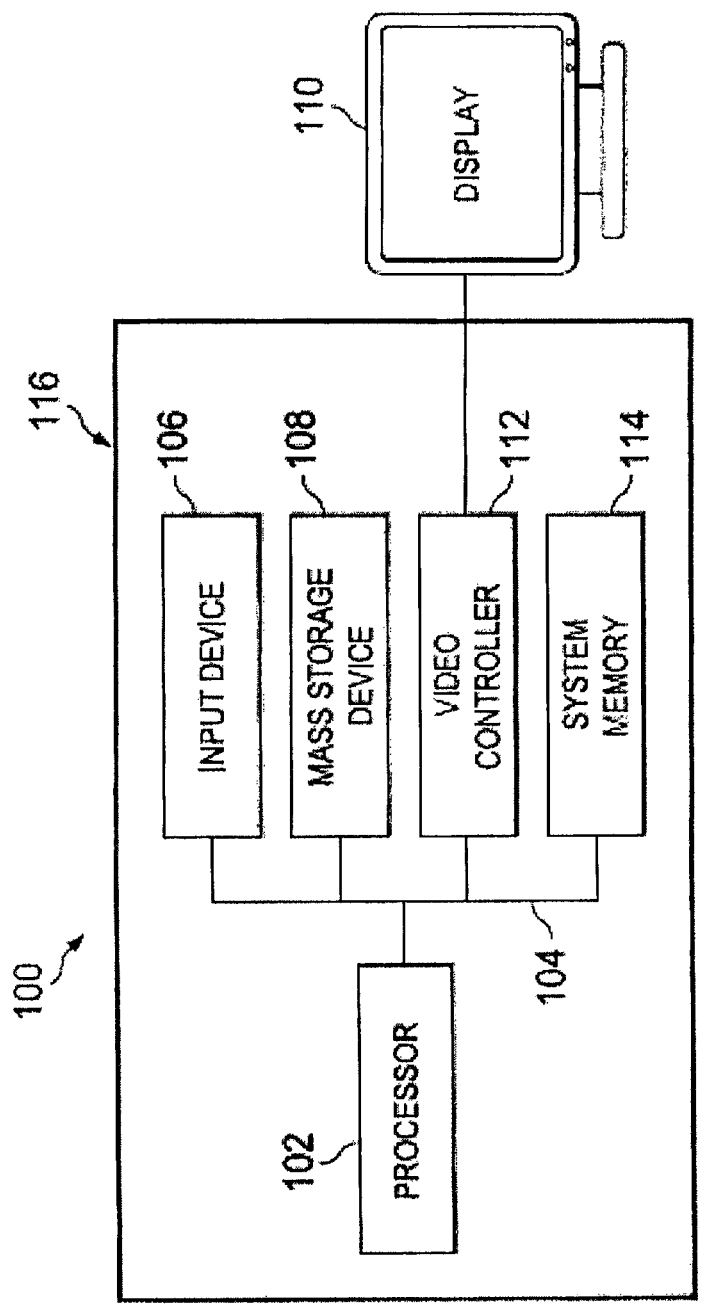
FIG. 1 is a schematic view illustrating an embodiment of an information handling system (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, an IHS chassis 116 houses some or all of the components of IHS 100. It should be understood that other buses and intermediate circuits can be deployed between the components described above and processor 102 to facilitate interconnection between the components and the processor 102.

Figure 2A:
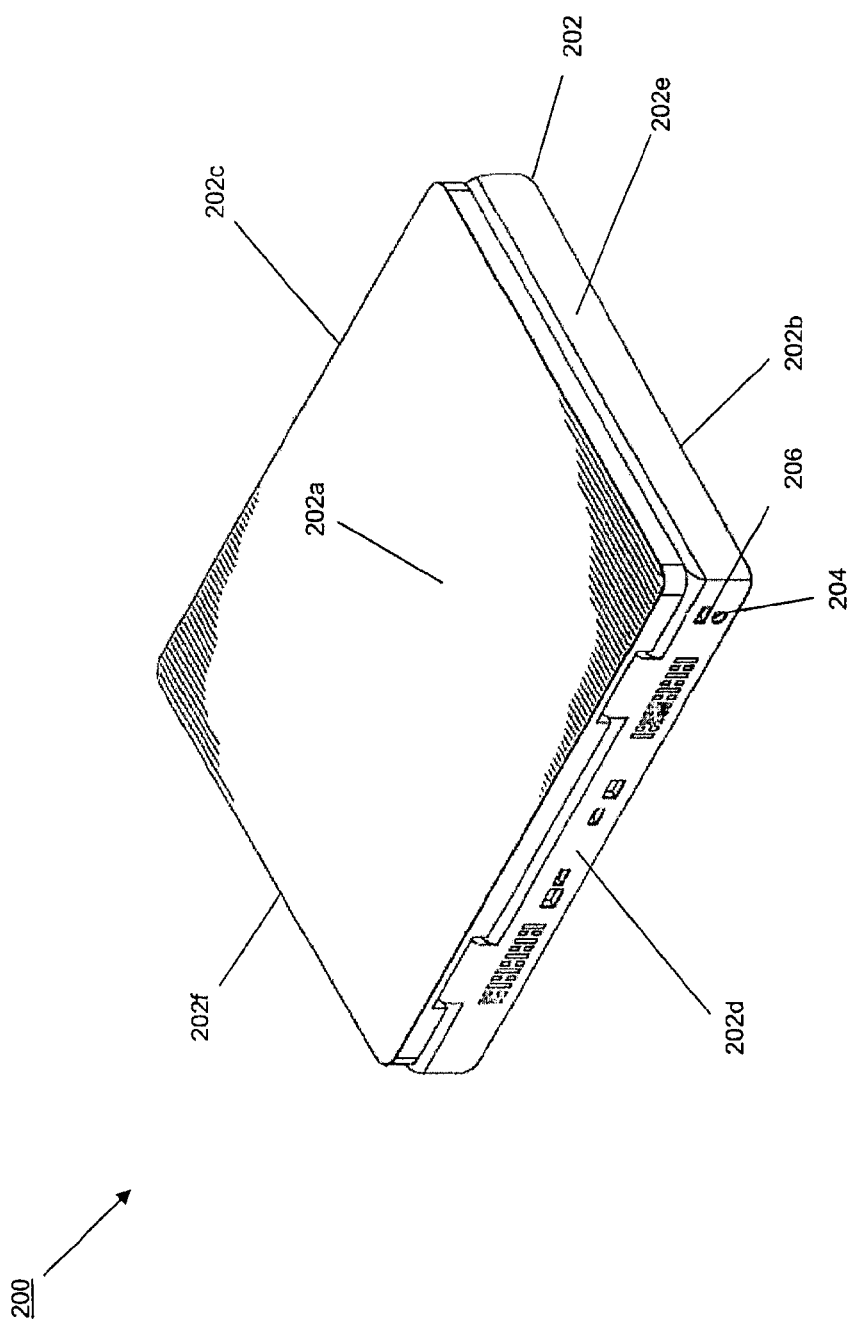
FIG. 2a is a perspective view illustrating an embodiment of the IHS of FIG. 1.

Referring now to FIGS. 2*a* and 2*b*, an IHS 200 is illustrated that may be the IHS 100 described above with reference to FIG. 1. The IHS 200 includes an IHS chassis 202 having a top surface 202*a*, a bottom surface 202*b* located opposite the IHS chassis 202 from the top surface 202*a*, a front surface 202*c* extending between the top surface 202*a* and the bottom surface 202*b*, a rear surface 202*d* located opposite the front surface 202*c* and extending between the top surface 202*a* and the bottom surface 202*b*, and a pair of opposing side surfaces 202*e* and 202*f* that extend between the top surface 202*a*, the bottom surface 202*b*, the front surface 202*c*, and the rear surface 202*d*. An IHS power connector 204 is located on the IHS chassis 200, extends into the IHS chassis 202 from the rear surface 202*d*, and is coupled a plurality of IHS components housed in the IHS chassis 202 (e.g., the IHS components discussed above with reference to the IHS 100 of FIG. 1.) An IHS security connector 206 is located on the rear surface 202*d* of the IHS 200 and adjacent to the IHS power connector 204. The IHS security connector 206 includes a passageway 206*a* that extends from the rear surface 202*d*, through the IHS chassis 202 and a reinforcing member 206*b*, and into a housing 208 that is defined by the IHS chassis 202 between the top surface 202*a*, the bottom surface 202*b*, the front surface 202*c*, the rear surface 202*d*, and the side surfaces 202*e* and 202*f*. In an embodiment, the reinforcing member 206*b* may include a metal or other material that is stronger than the material used for the wall that includes the rear surface 202*d* and/or that may be anchored to a structural element in the IHS chassis 202, as is known in the art.

Figure 3A:
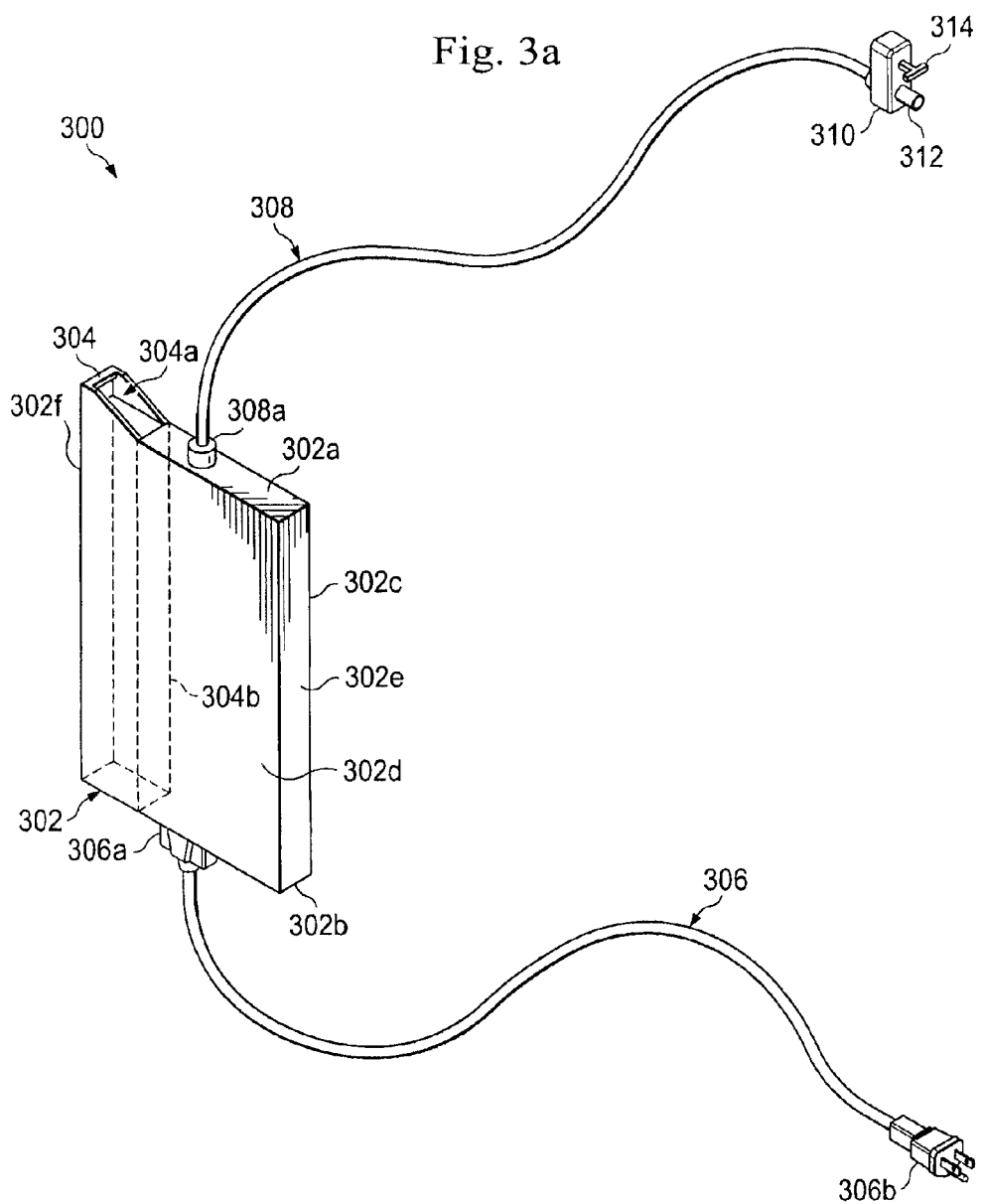
FIG. 3a is a perspective view illustrating an embodiment of a power adapter used with the IHS of FIGS. 2a and 2b.

Referring now to FIG. 3*a*, a power adapter 300 is illustrated. In an embodiment, the power adapter 300 may be a 65 watt power adapter, a 90 watt power adapter, an auto/air power adapter, and/or a variety of other power adapters known in the art. The power adapter includes a power adapter base 302 having a top surface 302*a*, a bottom surface 302*b* located opposite the power adapter base 302 from the top surface 302*a*, a front surface 302*c* extending between the top surface 302*a* and the bottom surface 302*b*, a rear surface 302*d* located opposite the front surface 302*c* and extending between the top surface 302*a* and the bottom surface 302*b*, and a pair of opposing side surfaces 302*e* and 302*f* that extend between the top surface 302*a*, the bottom surface 302*b*, the front surface 302*c*, and the rear surface 302*d*. An object securing element 304 is located on the power adapter base 302 and, in the illustrated embodiment, extends from the top surface 302*a* of the power adapter base 302 and defines a power cable passageway 304*a*. In an embodiment, the object securing element 304 includes a reinforced member 304*b* (illustrated with dashed lines in FIG. 3*a*) that may include, for example, a metal band that runs adjacent the bottom surface 302*b*, the front surface 302*c*, and the rear surface 302*d*, defines the power cable passageway 304*b* between itself and the top surface 302*a*, and that may be covered by a cover material (e.g., a plastic case) that includes the top surface 302*a*, the bottom surface 302*b*, the front surface 302*c*, the rear surface 302*d*, and the side surfaces 302*e* and 302*f*. A power cable 306 includes an adapter plug 306*a* that detachably connects to a connector (not illustrated) on the bottom surface 302*b* of the power adapter base 302, and an Alternating Current (AC) connector 306*b* located on a distal end of the power cable 306 opposite from the adapter plug 306*a*.

Figure 3C:
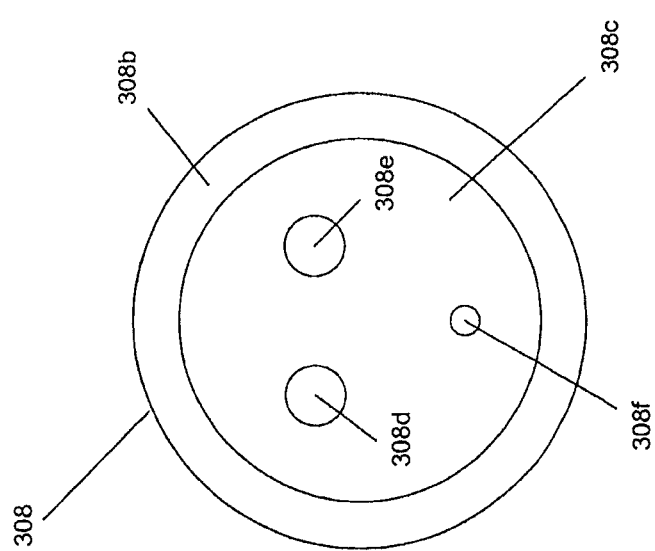

Referring now to FIGS. 3*a*, 3*b*, and 3*c*, a power cable 308 extends from the top surface 302*a* of the power adapter base 302 from a reinforced member 308*a* that is coupled to the power adapter base 302 using methods known in the art (e.g., by coupling the reinforced member 308*a* to a structure material in the power adapter base 302 and fabricating the reinforced member 308*a* out of a stronger material than that which makes up other portions of the power adapter base 302.) Furthermore, the power cable 308 may be fabricated from one or more reinforced materials 308*b* and/or 308*c* such as, for example, a braided metal, a braided non-metal, etc., and anchored to a structural element in the power adapter base 302 and a connector base 310 that is located on a distal end of the power cable 308 that is opposite the power adapter base 302. The power cable 308 also includes a plurality of power wires (e.g., a positive direct current wire 308*d* (DC+) and a negative direct current wire 308*e* (DC−)) and a power supply identification (PSID) wire 308*f* that extend from the power adapter base 302, through the power cable 308, and to an adapter power connector 312 that extends from the connector base 310. An adapter security connector 314 extends from the connector base 310 adjacent the adapter power connector 312 and is coupled to a key locking element 314*a* through the connector base 310. While examples of a plurality of reinforced members in the power adapter 300 have been described above, one of skill in the art will recognize that other reinforcements may be used for the elements in the power adapter 300 without departing from the scope of the present disclosure.

Figure 4C:
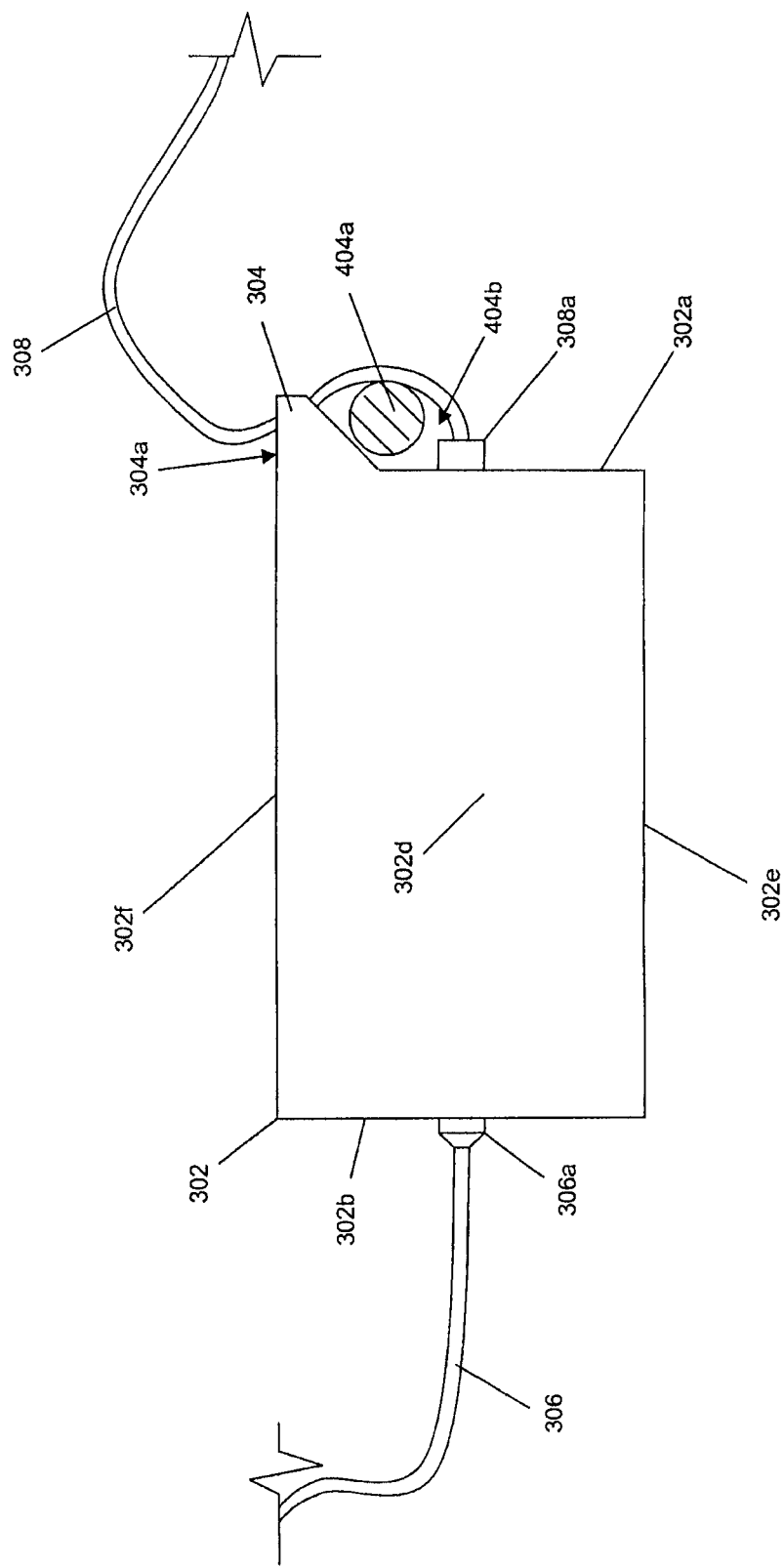
FIG. 4c is a top view illustrating an embodiment of the power adapter secured to the object of FIG. 4b.

Referring now to FIGS. 3*a*, 4*a*, 4*b*, and 4*c*, a method 400 for powering and securing an IHS is illustrated. The method 400 begins at block 402 where an IHS chassis and power adapter are provided. In an embodiment, the IHS 200 including the IHS chassis 202 and the power adapter 300 are provided. The method 400 then proceeds to block 404 where the power adapter is secured to an object. In an embodiment, an object 404*a* that is relatively immobile is provided. For example, the relatively immobile object 404*a* may be a table, a chair, a security bar provided for securing devices such as the IHS 200, and/or a variety of other relatively immobile objects known in the art. While the entirety of the relatively immobile object 404*a* is not illustrated in FIG. 4*b*, one of skill in the art will recognize that the relatively immobile object 404*a* may include a variety of features that, once the power adapter 300 has been secured the relatively immobile object 404a, prevent the power adapter 300 from being easily separated from the relatively immobile object 404a (e.g., without breaking the reinforced connections of the elements of the power adapter 300.) The connector base 310, the power cable 308, and the object securing element 304 may then be used to secure the power adapter base 302 to the object 404a by positioning the object 404a adjacent the reinforced member 308a on the power cable 308 and the top surface 302a on the power adapter base 302, and then moving the connector base 310 and the power cable 308 through the power cable passageway 304a defined by the object securing member 304 such that an object passageway 404b is defined between the power cable 308 and the power adapter base 302, and the object 404a is positioned in the object passageway 404b, as illustrated in FIGS. 4b and 4c. One of skill in the art will recognize that by using an appropriate object 404a and positioning the object 404a in the object passageway 404b as discussed above, the power adapter base 302 is secured to the object 404a until the connector base 310 and the power cable 308 are removed from the power cable passageway 304a.

Referring now to FIGS. 4a, 4b, and 4d, the method 400 then proceeds to block 406 where the power adapter is coupled to a power source. The power cable 306 has its the adapter plug 306a connected to a connector (not illustrated) on the bottom surface 302b of the power adapter base 302, and its AC connector 306b connected to an AC outlet 406a such that AC power from the AC outlet 406a may be transmitted through the power cord 306 and converted to DC power using circuitry in the power adapter base 302. The method 400 then proceeds to blocks 408 and 410 where the IHS security connector is engaged with the adapter security connector and the IHS power connector is engaged with the adapter power connector. The connector base 310 is positioned adjacent the rear surface 202d of the IHS chassis 202 such that the adapter power connector 312 is positioned adjacent the IHS power connector 204 and the adapter security connector 314 is positioned adjacent the IHS security connector 206. The connector base 310 is then moved towards the rear surface 202d of the IHS chassis 202 such that the adapter security connector 314 moves through the passageway 206a defined by the IHS security connector 206 and becomes located in the housing 208 defined by the IHS chassis 202, and the adapter power connector 312 engages the IHS power connector 204, as illustrated in FIG. 4b. One of skill in the art will recognize that the adapter security connector 314 may need to be oriented in a particular orientation to allow its movement through the passageway 206a. A user may then lock the power cable 308 to the IHS chassis 202 by, for example, using the key locking element 314a on the connector base 310 to reorient and lock into position the adapter security connector 314 such that the adapter security connector 314 may not be removed from the IHS security connector 206, as is known in the art. With the adapter power connector 312 engaging the IHS power connector 204, DC power provided by the power adapter base 302 may be transmitted through the power cable 308, the adapter power connector 312, and the IHS power connector 204 to the IHS components housed in the IHS chassis 202. Furthermore, with the adapter security connector 314 locked into position in the IHS security connector 206, as illustrated in FIG. 4d, the power cable 308 may not be easily separated from the IHS chassis 200 (e.g., without a key to unlock the adapter security connector 314 and the IHS security connector 206 using the key locking element 314a.)

Thus, a power adapter security system is provided that allows a user to carry around a single device that will provide power to an IHS and secure that IHS to an object, as with the object 404a positioned in the object passageway 404b defined by positioning the power cable 308 in the power cable passageway 304a, and the adapter security connector 314 locked to the IHS security connector 206 on the IHS chassis 202, as illustrated in FIG. 4b, the IHS chassis 202 may not be easily separated from the object 404a (e.g., without breaking the reinforced connections of the elements in the power adapter 300.)

Figure 5A:
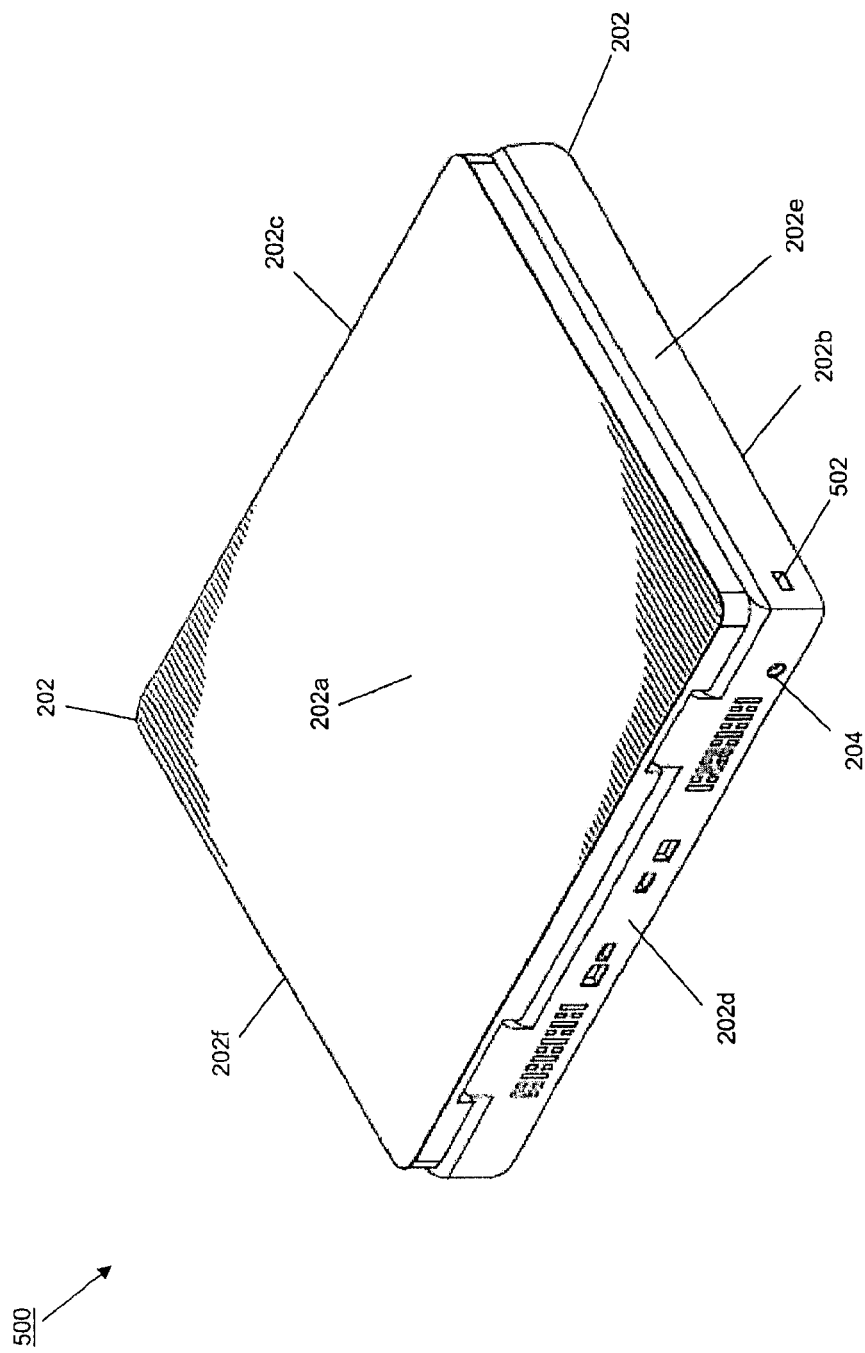
FIG. 5a is a perspective view illustrating an embodiment of an IHS.

Referring now to FIG. 5a, an embodiment of an IHS 500 is illustrated that is substantially similar in structure and operation to the IHS 200 described above, with the provision of an IHS security connector 502 replacing the IHS security connector 206. The IHS security connector 502 is positioned on the side surface 202e of the IHS chassis 202, and one of skill in the art will recognize that the positioning of IHS security connector 502 and the IHS power connector 204 on the IHS chassis 202 illustrated in FIG. 5a is conventional and typically requires a user to carry around a separate conventional power adapter and convention security cable including a security connector.

Referring now to FIG. 5b, an embodiment of a power adapter 504 is illustrated that is substantially similar in structure and operation to the power adapter 300 described above, with the provision of a power connector base 506 that is located on a distal end of the power cable 308 opposite the power cable 308 from the reinforced member 308a and that includes a power connector 506a, and a security cable 508 that splits off from the power cable 308 at a point along its length and includes a security connector base 510 on a distal end of the security cable 508 that is opposite the power cable 308 and that includes an adapter security connector 510a and a key locking element 510b. In an embodiment, the security cable 508 connections to the power cable 308 and the security connector base 510 may be reinforced similarly as discussed above.

Referring now to FIGS. 5a, 5b, and 5c, in operation, the IHS 500 and the power adapter 504 may be operated according to the method 400 in substantially the same manner as described above for the IHS 200 and the power adapter 300. At block 408 of the method 400, the IHS security connector 206 and the adapter security connector 510a may be engaged and locked together using the key locking element 510b, as illustrated in FIG. 5c, in substantially the same manner as described above for the IHS security connector 206 and the adapter security connector 314. At block 410 of the method 400, the IHS power connector 204 and the adapter power connector 506a may be engaged, as illustrated in FIG. 5c, in substantially the same manner as described above for the IHS power connector 204 and the adapter power connector 312 to provide power to the IHS 500. Thus, a power adapter security system is provided that allows a user to carry around a single device that will provide power to a conventional IHS and secure that conventional IHS to an object.

Referring now to FIG. 6b, an embodiment of a power adapter 600 is illustrated that is substantially similar in structure and operation to the power adapter 300 described above, with the provision of an object securing element 602 replacing the object securing element 304. The object securing element 602 includes a substantially U-shaped member 602a that is detachable from the power adapter base 302 and lockable to the power adapter base 302 through a locking aperture 602b defined by the power adapter base 602 and a key locking element 602c. In an embodiment, the power adapter base 302 on the power adapter 600 may include reinforcements (e.g., similar to the reinforced members on the power adapter 300)

adjacent the connection points of the object securing element 602 and anchored to structural elements in the power adapter base 302.

Figure 6A:
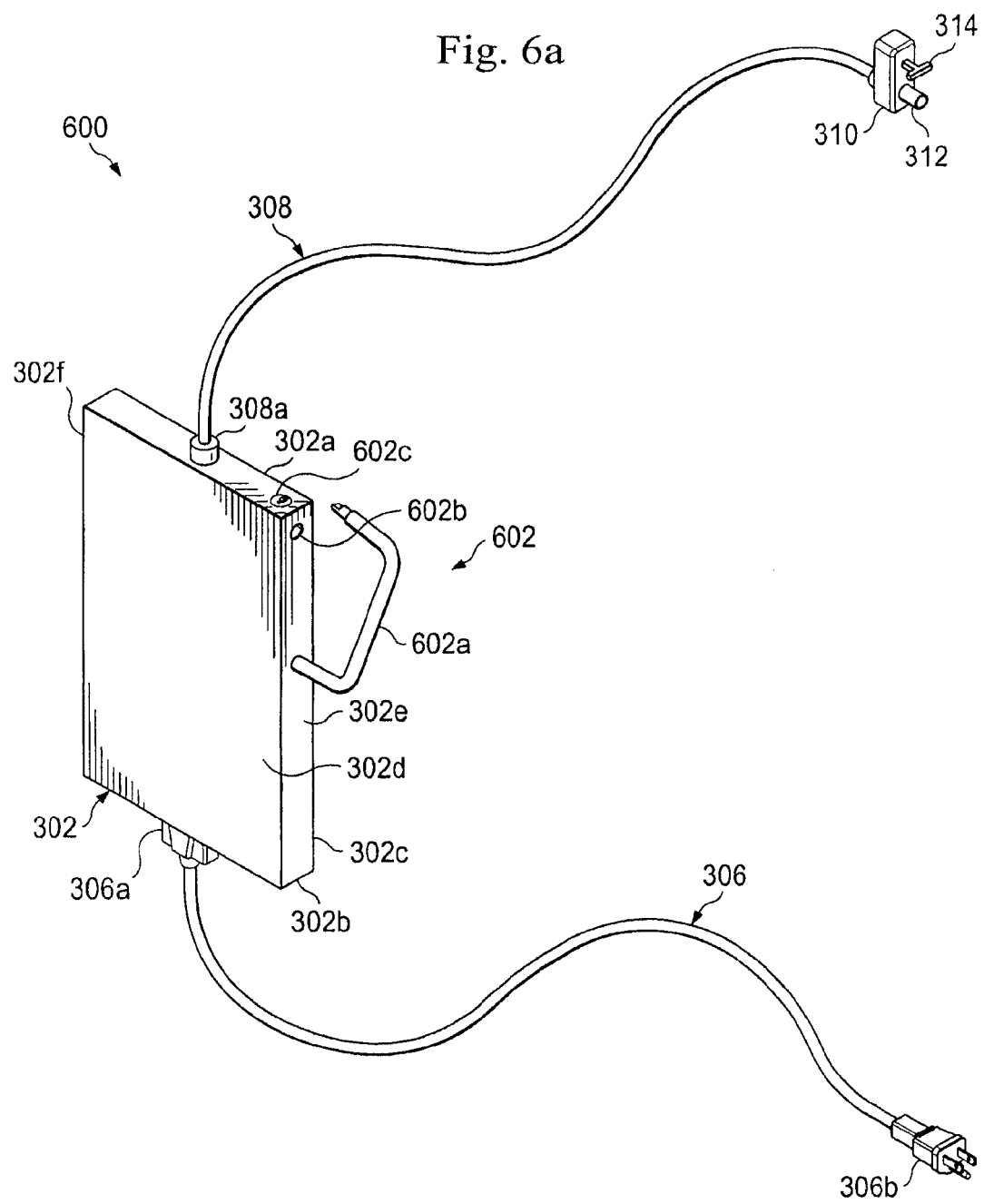
FIG. 6a is a perspective view illustrating an embodiment of a power adapter used with the IHS of FIGS. 2a and 2b.

Referring now to FIGS. 6a and 6b, in operation, the IHS 200 and the power adapter 600 may be operated according to the method 400 in substantially the same manner as described above for the IHS 200 and the power adapter 300. At block 404 of the method 400, the object securing element 602 is detached from the power adapter base 302 and then reattached to the power adapter base 302 such that the object 404a is positioned in an object passageway 604 that is defined between the U-shaped member 602a and the power adapter base 302, as illustrated in FIG. 6b. A user may lock the object securing element 602a to the power adapter base 302 using the key locking element 602c such that the U-shaped member 602a is not easily separated from the power adapter base 302. In an embodiment, the same key may be provided for the key locking element 314a on the connector base 310 and the key locking element 602c on the power adapter base 300. Thus, a power adapter security system is provided that allows a user to carry around a single device that will provide power to an IHS and secure that IHS to an object, as with the object 404a positioned in the object passageway 604 that is defined by locking the U-shaped member 602 to the power adapter base 302, as illustrated in FIG. 6b, the IHS chassis 202 may not be easily separated from the object 404a.

Figure 7:
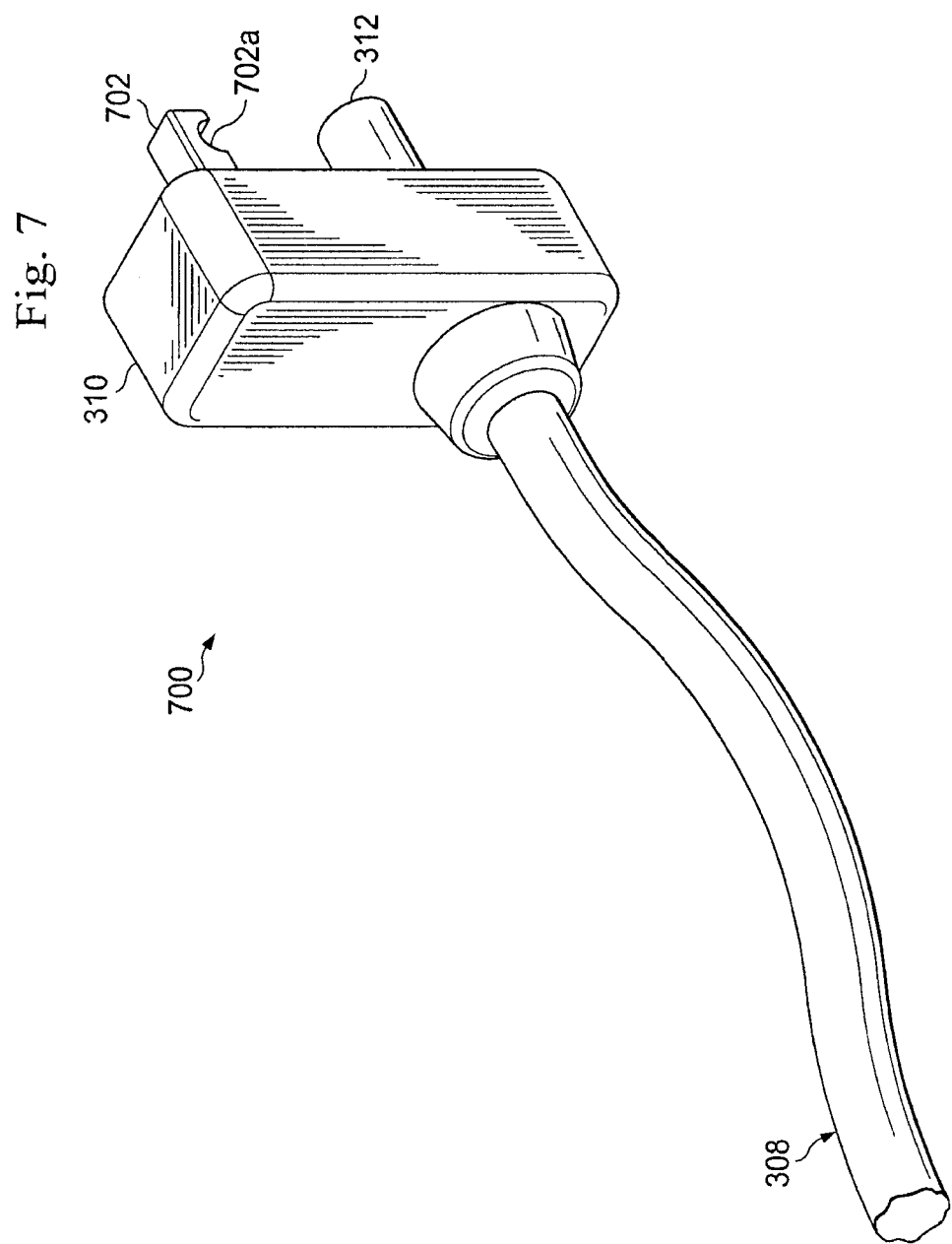
FIG. 7 is a perspective view illustrating an embodiment of a connector base that is located on the power adapter of FIG. 3a and that includes an adapter power connector and an adapter security connector.

Referring now to FIG. 7, a alternative power adapter 700 is illustrated that is substantially the same in structure and operation to the power adapter 300 described above, with the provision of a adapter security connector 702 replacing the adapter security connector 314. The adapter security connector 702 defines a locking feature 702a that is located adjacent a distal end of the adapter security connector 702 that is opposite the connector base 310.

Figure 8:
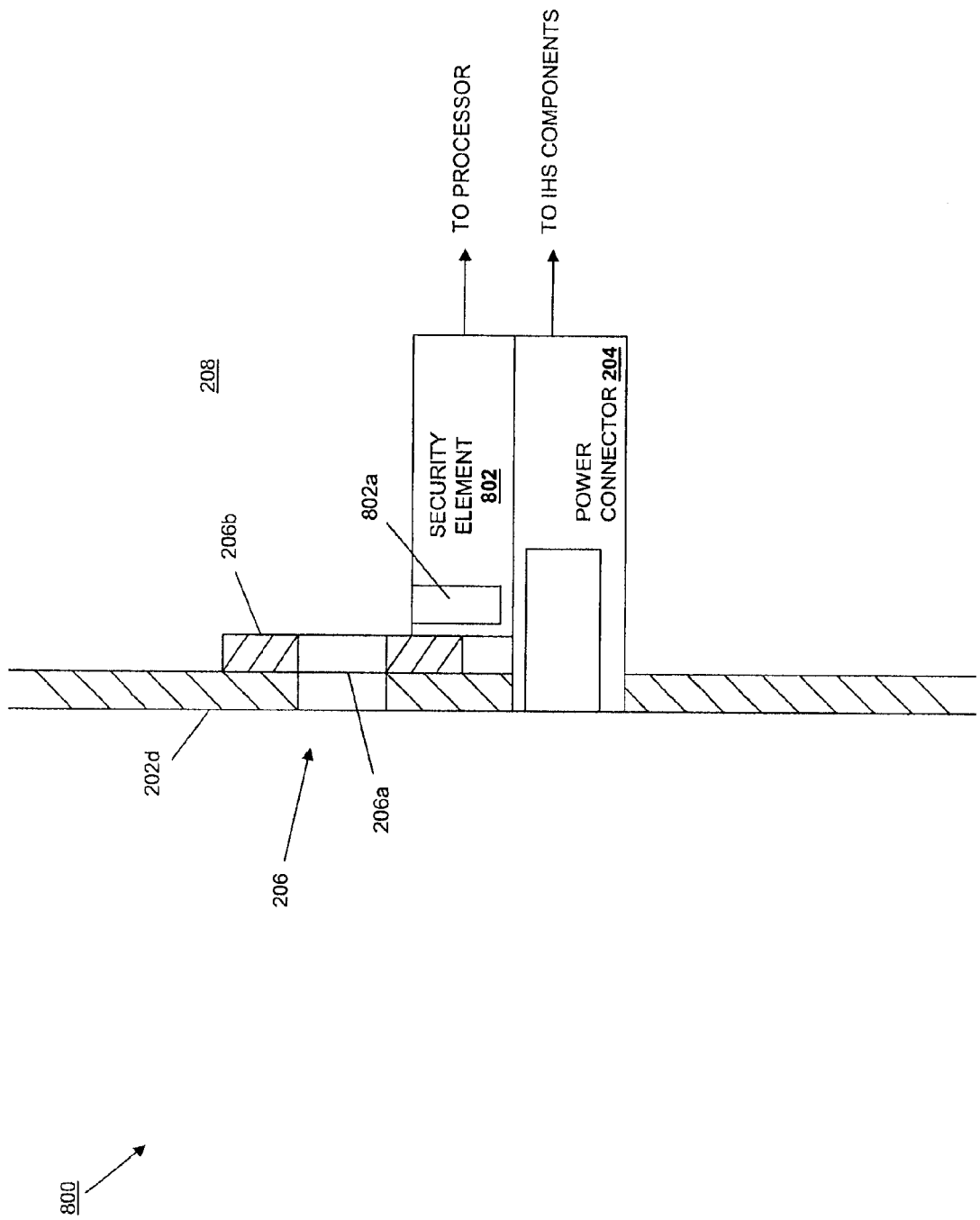

Referring now to FIG. 8, a alternative IHS 800 is illustrated that is substantially the same in structure and operation to the IHS 200 described above, with the provision of a security element 802 included with the IHS security connector 206 and position adjacent the passageway 206a. The security element 802 includes a moveable locking member 802a and is coupled to a processor including in the IHS 200 and housed in the IHS chassis 202.

Figure 9A:
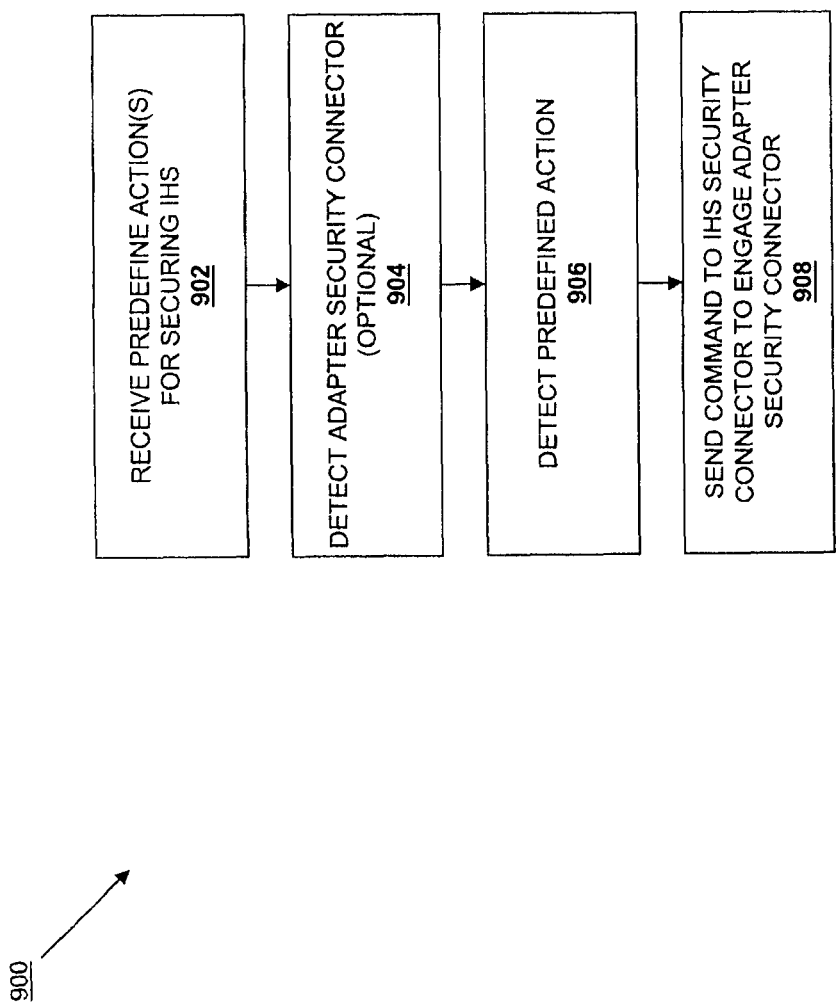
FIG. 9a is a flow chart illustrating an embodiment of a method for securing an IHS.
Figure 9B:
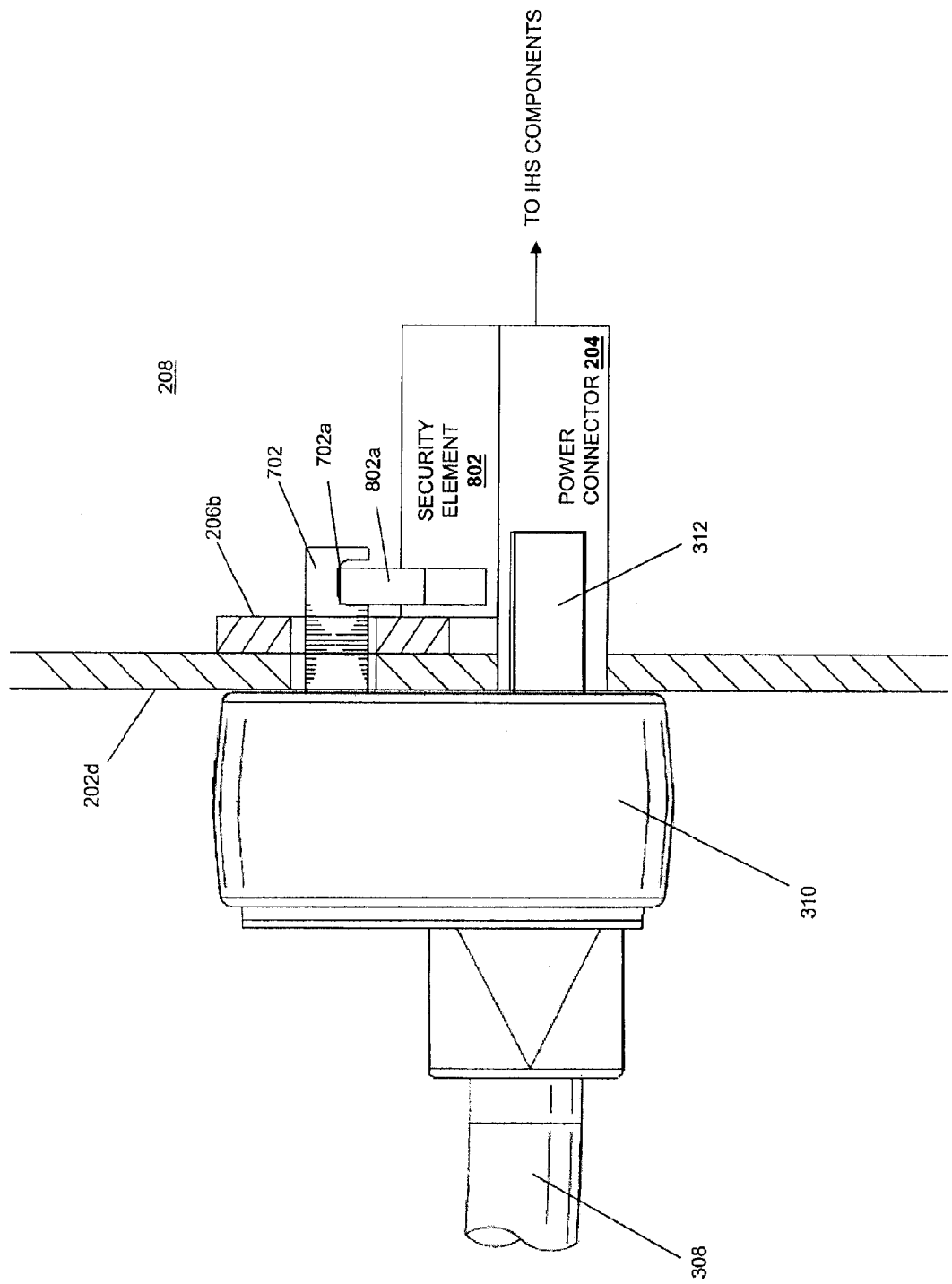
FIG. 9b is a cross-section view illustrating an embodiment of the adapter security connector of FIG. 7 secured to the IHS of FIG. 8.

Referring now to FIGS. 9a and 9b, a method 900 for securing an IHS chassis to an object is illustrated. In an embodiment, at least part of the method 900 may be performed during the method 400 described above (e.g., element 408 of the method 400.) The method begins at block 902 where at least one predefined action for securing an IHS is received. For example, a default may be provided, or a user may store, in a non-transitory, computer-readable medium (e.g., a memory) of the IHS 800, at least one predefined action that includes instructions that, when executed by a processor of the IHS 800, cause the processor to actuate the locking member 802a. In an embodiment, the predefined action may include a user logging into the IHS 800, a user logging out of the IHS 800, a period of time passing from the IHS 800 being powered on, a user providing a passcode to the IHS 800, and/or a variety of other predefined actions known in the art. The method 900 may then optionally proceed to block 904 where an adapter security connector is detected. For example, according to the method 400 described above, the adapter security connector 702 may be positioned in the passageway 206a of the IHS security connector 206, as illustrated in FIG. 9b, and the security element 802 may include a device for detecting that the adapter security connector 702 is positioned in the passageway 206a of the IHS security connector 206. In an embodiment, the coupling of the adapter power connector 312 to the IHS power connector 204 may cause the PSID wire 308f to send a signal to the processor that indicates the power adapter 700 includes the adapter security connector 702 such that the adapter security connector 702 is detected. In an embodiment, the method 900 may end if the adapter security connector 702 is not detected in block 904. The method 900 then proceeds to block 906 where a predefined action is detected. In an embodiment, the processor may determine a predefined action that was received in block 902 of the method 900 has occurred. The method 900 then proceeds to block 908 where a command is sent to the IHS security connector to engage the adapter security connector. In response to detecting the predefined action in block 906 of the method 900, the processor may send a command to the security element 802 to actuate the locking member 802a in order to move the locking member into the locking feature 702a defined by the adapter security connector 702 and into engagement with the adapter security connector 702, as illustrated in FIG. 9b. With the locking member 802a engaging the adapter security connector 702, the power cable 308 is secured to the IHS chassis 202 such that it may not be easily separated from the IHS chassis 202. In an embodiment, the locking member 802a may be disengaged from the adapter security connector 702 in response to detecting another predefined action (e.g., a user logging off of the IHS 800, in response to the user providing a passcode, and/or in response to a variety of other actions known in the art.) Thus, a security system is provided that allow a user to physically lock an IHS chassis to a security cable by performing a predefined action that results in a locking member 802a engaging an adapter security connector 702 to secure a power and/or security cable 308 to the IHS chassis 202.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A power adapter security system, comprising:
   a power adapter base;
   an object securing element located on the power adapter base and configured to secure the power adapter base to an object;
   a power cable extending from the power adapter base and including a power cable distal end opposite the power adapter base;
   a power connector that is located on the power cable distal end and that is configured to transmit power from the power adapter base;
   a security cable that extends from the power cable from a location along the length of the power cable between the power adapter base and the power cable distal end, wherein the security cable includes a security cable distal end opposite the power cable; and
   a security connector that is located on the security cable distal end and that is configured to lock to a device, wherein the extension of the security cable from the power cable is configured to allow for movement of the power connector relative to the security connector such that the distance between the power connector and the security connector may be increased or decreased.

2. The system of claim 1, wherein the object securing element defines a power cable passageway, and wherein the object securing element is configured to secure the power adapter base to an object through the positioning of the power cable in the power cable passageway to define an object passageway between the power cable and the power adapter base in which the object is positioned.

3. The system of claim 1, wherein the object securing element defines an object passageway between the object securing element and the power adapter base, and wherein the object securing element is configured to secure the power adapter base to an object by detaching the object securing element from the power adapter base and then reattaching the object securing element to the power adapter base such that the object is positioned in the object passageway.

4. The system of claim 1, further comprising:
a power connector base located on the power cable distal end, wherein the power connector extends from the power connector base; and
a security connector base located on the security cable distal end, wherein the security connector extends from the security connector base.

5. The system of claim 1, wherein each of the object securing element, the power cable, and the security cable are reinforced.

6. The system of claim 1, wherein the security connector defines a locking feature that is configured to lock to the device by engaging a moveable locking member that is located in the device.

7. An information handling system (IHS), comprising:
an IHS chassis including a first outer surface and a second outer surface that faces a different direction than the first outer surface;
an IHS power connector located on the first outer surface;
an IHS security connector located on the second outer surface;
a processor housed in the IHS chassis;
a power adapter base;
an object securing element located on the power adapter base and configured to secure the power adapter base to an object;
a power cable extending from the power adapter base and including a power cable distal end opposite the power adapter base;
an adapter power connector that is located on the power cable distal end and that is configured to engage the IHS power connector to transmit power to the IHS from the power adapter base;
a security cable that extends from the power cable from a location along the length of the power cable between the power adapter base and the power cable distal end, wherein the security cable includes a security cable distal end opposite the power cable; and
an adapter security connector that is located on the security cable distal end and that is configured to engage the IHS security connector to lock to the IHS chassis, wherein the extension of the security cable from the power cable is configured to allow for movement of the adapter power connector relative to the adapter security connector such that the distance between the power connector and the security connector may be increased or decreased.

8. The system of claim 7, wherein the object securing element defines a power cable passageway, and wherein the object securing element is configured to secure the power adapter base to an object through the positioning of the power cable in the power cable passageway to define an object passageway between the power cable and the power adapter base in which the object is positioned.

9. The system of claim 7, wherein the object securing element defines an object passageway between the object securing element and the power adapter base, and wherein the object securing element is configured to secure the power adapter base to an object by detaching the object securing element from the power adapter base and then reattaching the object securing element to the power adapter base such that the object is positioned in the object passageway.

10. The system of claim 7, further comprising:
a power connector base located on the power cable distal end, wherein the adapter power connector extends from the power connector base; and
a security connector base located on the security cable distal end, wherein the adapter security connector extends from the security connector base.

11. The system of claim 7, wherein each of the object securing element, the adapter power cable, and the adapter security cable are reinforced.

12. The system of claim 7, wherein the adapter security connector defines a locking feature that is configured to lock to the IHS chassis by engaging a locking member that is actuated by the IHS security connector.

13. The system of claim 12, wherein the IHS security connector is configured to actuate the locking member in response to receiving a command from the processor that is sent in response to detecting that a predetermined amount of time has passed subsequent to powering on the IHS.

14. A method for powering and securing an information handling system (IHS), comprising:
providing a power adapter including a power adapter base having an object securing element, a power cable extending from the power adapter base and including a power cable distal end, an adapter power connector located on the power cable distal end, a security cable extending from the power cable from a location along the length of the power cable between the power adapter base and the power cable distal end, and an adapter security connector located on the security cable distal end;
securing the power adapter to an object using the object securing element;
coupling the power adapter to a power source;
engaging an IHS security connector on an IHS chassis with the adapter security connector to lock the adapter security connector to the IHS chassis, wherein the extension of the security cable from the power cable allows for movement of the adapter security connector relative the adapter power connector such that the distance between the adapter security connector and the adapter power connector may be increased or decreased when engaging the adapter security connector with the IHS security connector; and
providing power from the power source to the IHS by engaging the adapter power connector and an IHS power connector on the IHS chassis, wherein the extension of the security cable from the power cable allows for movement of the adapter power connector relative the adapter security connector such that the distance between the adapter power connector and the adapter security connector may be increased or decreased when engaging the adapter power connector with the IHS power connector.

15. The method of claim 14, wherein the securing the power adapter to the object includes positioning the power cable in a power cable passageway defined by the object securing element such that an object passageway is defined between the power cable and the power adapter base and the object is positioned in the object passageway.

16. The system of claim 14, wherein the securing the power adapter to the object includes detaching the object securing element from the power adapter base and then reattaching the object securing element to the power adapter base such that the object is positioned in an object passageway that is defined between the object securing element and the power adapter base.

17. The system of claim 14, wherein the engaging the IHS security connector with the adapter security connector to lock the power cable to the IHS chassis includes the IHS security connector receiving a command from a processor that is sent in response to detecting that a predetermined amount of time has passed subsequent to powering on the IHS, and in response to receiving the command, actuating a locking member to engage the adapter security connector.

18. The system of claim 14, wherein each of the object securing element, the adapter power cable, and the adapter security cable are reinforced.

\* \* \* \* \*